(12) United States Patent
Sriraman et al.

(10) Patent No.: US 10,359,706 B1
(45) Date of Patent: Jul. 23, 2019

(54) INTEGRATED SCANNING ELECTRON MICROSCOPY AND OPTICAL ANALYSIS TECHNIQUES FOR ADVANCED PROCESS CONTROL

(71) Applicant: KLA-Tencor Corporation, Milpitas, CA (US)

(72) Inventors: Hari Pathangi Sriraman, Chennai (IN); Sivaprrasath Meenakshisundaram, Lawspet (IN); Arun Lobo, Mangalore (IN)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/103,386

(22) Filed: Aug. 14, 2018

(30) Foreign Application Priority Data

Jun. 11, 2018  (IN) .............................. 201841021710
Jun. 21, 2018  (IN) .............................. 201841023172

(51) Int. Cl.
  *G03F 7/20* (2006.01)

(52) U.S. Cl.
  CPC ...... *G03F 7/70625* (2013.01); *G03F 7/70141* (2013.01); *G03F 7/70633* (2013.01)

(58) Field of Classification Search
  CPC ............. G03F 7/70625; G03F 7/70633; G03F 7/7065; G03F 7/70616; G03F 7/70608; G03F 7/70658
  See application file for complete search history.

(56) References Cited

U.S. PATENT DOCUMENTS

| | | | |
|---|---|---|---|
| 6,388,253 B1 * | 5/2002 | Su ....................... | G03F 7/70558 250/252.1 |
| 8,284,394 B2 | 10/2012 | Kirk et al. | |
| 8,422,010 B2 | 4/2013 | Kirk et al. | |
| 8,611,639 B2 | 12/2013 | Kulkarni et al. | |
| 2015/0213172 A1 * | 7/2015 | Luoh .................. | G06F 17/5045 716/102 |
| 2017/0235233 A1 * | 8/2017 | Lee ...................... | G03F 9/7003 355/67 |

* cited by examiner

*Primary Examiner* — Steven Whitesell Gordon
(74) *Attorney, Agent, or Firm* — Suiter Swantz pc llo

(57) ABSTRACT

A sample analysis system includes a scanning electron microscope, an optical and/or eBeam inspection system, and an optical metrology system. The system further includes at least one controller. The controller is configured to receive a first plurality of selected regions of interest of the sample; generate a first critical dimension uniformity map based on a first inspection performed by the scanning electron microscope at the first selected regions of interest; determine a second plurality of selected regions of interest based on the first critical dimension uniformity map; generate a second critical dimension uniformity map based on a second inspection performed by the optical and/or eBeam inspection system at the second selected regions of interest; and determine one or more process tool control parameters based on inspection results and on overlay measurements performed on the sample by the optical metrology system.

29 Claims, 9 Drawing Sheets

INTEGRATED SCANNING ELECTRON MICROSCOPY AND OPTICAL ANALYSIS TECHNIQUES FOR ADVANCED PROCESS CONTROL

CROSS-REFERENCE TO RELATED APPLICATIONS

The present application claims priority to India Provisional Patent Application No. 201841021710, filed Jun. 11, 2018, entitled INTEGRATED SEM-BASED METROLOGY, INSPECTION AND REVIEW WITH OPTICAL METHODS FOR ADVANCED PROCESS CONTROL (APC), and naming Hari Pathangi, Sivaprrasath Meenakshisundaram, and Arun Lobo as inventors. The present application also claims priority to India Provisional Patent Application No. 201841023172, filed Jun. 21, 2018, entitled INTEGRATED SCANNING ELECTRON MICROSCOPY AND OPTICAL ANALYSIS TECHNIQUES FOR ADVANCED PROCESS CONTROL, and naming Hari Pathangi Sriraman, Sivaprrasath Meenakshisundaram, and Arun Lobo as inventors. India Provisional Patent Application No. 201841021710 and India Provisional Patent Application No. 201841023172 are incorporated herein by reference in their entirety.

TECHNICAL FIELD

The present disclosure relates generally to systems and methods for sample analysis and more particularly to systems and methods that employ integrated scanning electron microscopy and optical analysis techniques for advanced process control.

BACKGROUND

Lithography/dry etch processes often yield critical dimension (CD) or feature size non-uniformity across a substrate (e.g., a wafer). Being able to characterize such non-uniformity is critical for process control in semiconductor manufacturing, as it translates to wafer yield and final device performance. There are a variety of metrology and/or inspection tools that can be used to analyze samples (e.g., wafers or other substrates) to determine feedback or feedforward data for advanced process control (APC) loops. SEM tools have good sensitivity to offer in any inspection or metrology application, but SEM tools tend to be much slower than optical tools. Accordingly, improvements are needed for SEM-based inspection and metrology systems.

SUMMARY

A sample analysis system that employs integrated scanning electron microscopy and optical analysis techniques for advanced process control (APC) is disclosed in accordance with one or more illustrative embodiments of the present disclosure. In one illustrative embodiment, the system includes a scanning electron microscope (SEM), an optical inspection system, and an optical metrology system. In embodiments, the system further includes at least one controller communicatively coupled to the SEM, the optical inspection system, and the optical metrology system. In embodiments, the controller is configured to receive a first plurality of selected regions of interest of the sample and generate a first critical dimension uniformity map for the sample based on a first inspection performed by the SEM at the first plurality of selected regions of interest. In embodiments, the controller is further configured to determine a second plurality of selected regions of interest of the sample based on the first critical dimension uniformity map and generate a second critical dimension uniformity map for the sample based on a second inspection performed by the optical inspection system at the second plurality of selected regions of interest. In embodiments, the controller is further configured to determine one or more process tool control parameters at least partially based on the second critical dimension uniformity map and on overlay measurements performed on the sample by the optical metrology system.

In another illustrative embodiment, the system includes a SEM, an electron beam (eBeam) inspection system, and an optical metrology system. In embodiments, the system further includes at least one controller communicatively coupled to the SEM, the eBeam inspection system, and the optical metrology system. In embodiments, the controller is configured to receive a first plurality of selected regions of interest of the sample and generate a first critical dimension uniformity map for the sample based on a first inspection performed by the SEM at the first plurality of selected regions of interest. In embodiments, the controller is further configured to determine a second plurality of selected regions of interest of the sample based on the first critical dimension uniformity map and generate a second critical dimension uniformity map for the sample based on a second inspection performed by the eBeam inspection system at the second plurality of selected regions of interest. In embodiments, the controller is further configured to determine one or more process tool control parameters at least partially based on the second critical dimension uniformity map and on overlay measurements performed on the sample by the optical metrology system.

A method that employs integrated scanning electron microscopy and optical analysis techniques for APC is also disclosed in accordance with one or more illustrative embodiments of the present disclosure. In one illustrative implementation of the method, a first plurality of selected regions of interest of a sample are received (e.g., based on a user input, APC tool output, or the like). A first inspection is performed at the first plurality of selected regions of interest of the sample with a SEM, and a first critical dimension uniformity map for the sample is generated based on the first inspection. A second plurality of selected regions of interest of the sample can be determined based on the first critical dimension uniformity map. In implementations, a second inspection is performed at the second plurality of selected regions of interest of the sample with an optical inspection system and/or an eBeam inspection system, and a second critical dimension uniformity map for the sample is generated based on the second inspection. In implementations, overlay measurements are also performed on the sample with an optical metrology system. One or more process tool control parameters can then be determined at least partially based on the second critical dimension uniformity map and the overlay measurements.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Characterizing CD or overlay error variations or defect densities can be critical for process control in semiconductor manufacturing, as it translates to wafer yield and final device performance. There are a variety of metrology and/or inspection tools that can be used to analyze samples (e.g., wafers or other substrates) to determine feedback or feedforward data for advanced process control (APC) loops. Optical tools have the advantage of relatively fast throughput while lagging in spatial resolution. On the other hand, scanning electron microscopes (SEMs) generally have better sensitivity than optical tools but tend to be much slower.

Systems and methods that combine the individual advantages of optical and SEM platforms are disclosed. With such systems and methods, it is possible to achieve an improved data set that can be used for feedforward and feedback exercises in a fab for device variability compensation at selected throughput constraints. With smaller technology nodes, increasing complexity of patterns and integration solutions, SEM-based techniques are claiming an increased share in inspection-review and metrology tests. This disclosure describes systems and methods that integrate various types of process control data generated using an SEM-based platform with process control data collected by one or more optical tools (e.g., optical inspection and/or metrology tools) to come up with appropriate data for APC feedback and/or feedforward loops.

Figure 1:
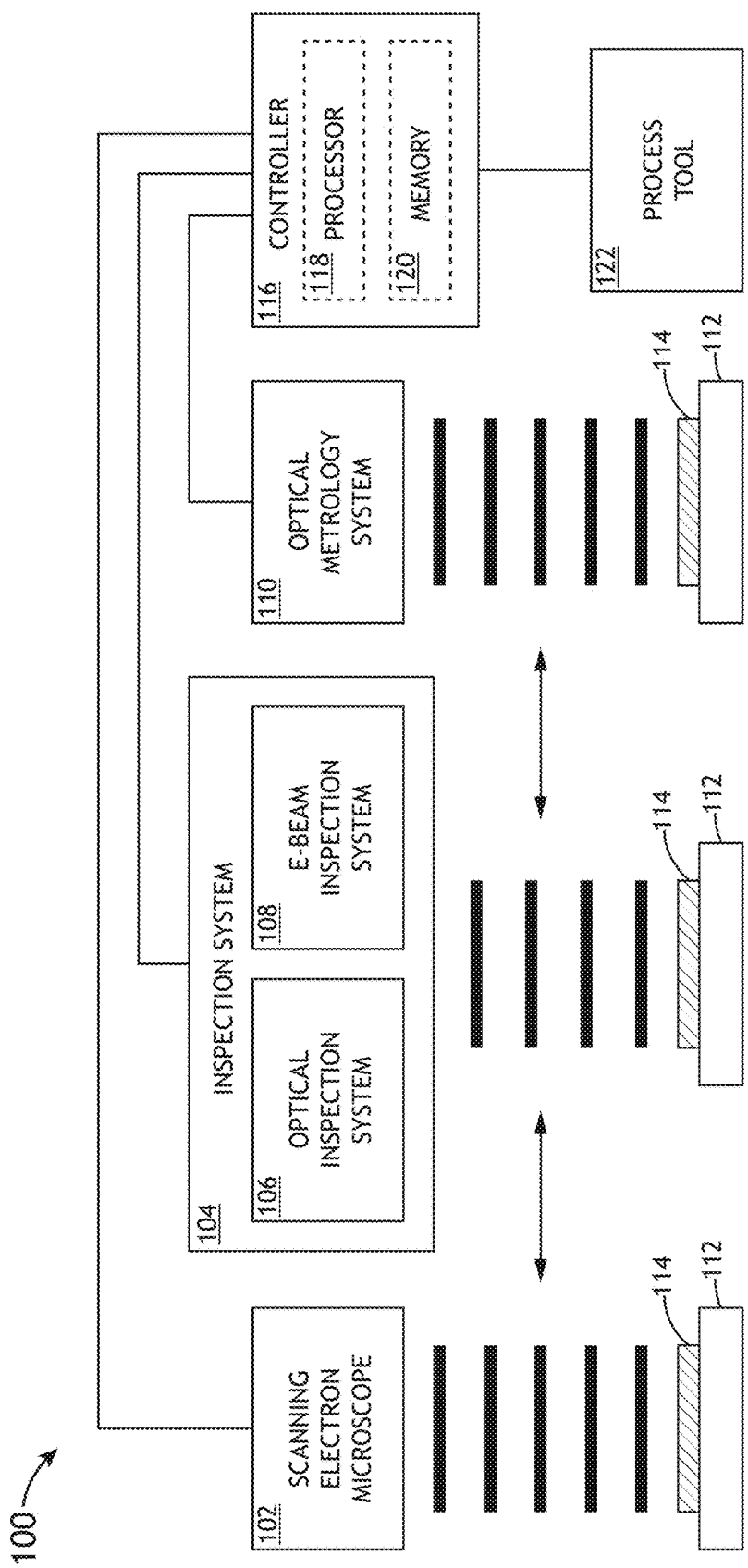
FIG. 1 is a schematic illustration of a system that employs integrated scanning electron microscopy and optical analysis techniques for advanced process control, in accordance with one or more embodiments of the present disclosure.

A sample analysis system 100 that employs integrated scanning electron microscopy and optical analysis techniques for APC is disclosed in accordance with one or more illustrative embodiments of the present disclosure. FIG. 1 illustrates an example embodiment of the system 100. The system 100 can be used to analyze at least one surface of a sample 114 (e.g., a wafer, board, panel, reticle, or any other substrate). In embodiments, the system includes a SEM 102 (e.g., KLA-Tencor Corporation's eDR 7xxx review tool series, eSLxx inspection tool series with integrated or offline CD measurement capability, or the like), an inspection system 104 that comprises an optical inspection system 106 (e.g., a broadband plasma inspection system, laser sustained plasma inspection system, KLA-Tencor Corporation's broadband plasma KLA2xxx or 3xxx series (e.g., 2925, 3905 . . . ) series inspection systems, or the like) and/or an electron beam (eBeam) inspection system 108 (e.g., KLA-Tencor Corporation's eSLxx series eBeam wafer defect inspection platform, or the like), and an optical metrology system 110 (e.g., an optical overlay metrology system, KLA-Tencor Corporation's ARCHER series overlay metrology systems, or the like). As further described herein, the system 100 can be configured to implement an analysis process (e.g., method 300) that leverages the independent capabilities of each of these inspection/metrology tools (i.e., the SEM 102, inspection system 104, and optical metrology system 110) to improve sensitivity and throughput for APC feedback and/or feedforward loops.

The sample 114 is supported by one or more support members 112. For example, the one or more support members 112 may include one or more sample stages, chucks, or the like. In some embodiments, each of the inspection/metrology tools (e.g., SEM 102, inspection system 104, optical metrology system 110) have one or more support members 112 configured to support the sample 114 when the sample 114 is analyzed by the inspection/metrology tool. In other embodiments, two or more of the inspection/metrology tools can be configured to share one or more support members 112. For example, the inspection/metrology tools may have shared or adjacently disposed probes, detectors, and/or optics. Furthermore, the one or more support members 112 may be actuatable (e.g., configured to move along a track), or the one or more support members 112 may include or can be coupled with a conveyor that moves the sample 114 from a respective support member 112 of a first inspection/metrology tool to a respective support member 112 of a second inspection/metrology tool, and so on. In other embodiments, the sample 114 may be moved from one inspection/metrology tool to another manually or using a robotic arm to pick up the sample 114 and move it to the next tool.

In embodiments, the system 100 further includes a controller 116 communicatively coupled to the inspection/metrology tools of the system 100. For example, the controller 116 (or a plurality of controllers 116) can be communicatively coupled to the SEM 102, inspection system 104 (e.g., to an optical inspection system 106 and/or an eBeam inspection system 108), and/or the optical metrology system 110. In some embodiments, the controller 116 includes one or more processors 118 configured to execute program instructions maintained on a memory medium 120. In this regard, the one or more processors 118 of controller 116 may execute any of the various process steps or operations described throughout the present disclosure.

The one or more processors 118 of a controller 116 may include any processing element known in the art. In this sense, the one or more processors 118 may include any microprocessor-type device configured to execute algorithms and/or instructions. In one embodiment, the one or more processors 118 may comprise a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 120.

The memory medium 120 may include any storage medium known in the art suitable for storing program instructions executable by the associated one or more processors 118. For example, the memory medium 120 may include a non-transitory memory medium. By way of another example, the memory medium 120 may include, but is not limited to, a read-only memory, a random access memory, a magnetic or optical memory device (e.g., disk), a magnetic tape, a solid state drive and the like. It is further noted that memory medium 120 may be housed in a common controller housing with the one or more processors 118. In one embodiment, the memory medium 120 may be located remotely with respect to the physical location of the one or more processors 118 and controller 116. For instance, the one or more processors 118 of controller 116 may access a remote memory (e.g., server), accessible through a network (e.g., internet, intranet and the like). Therefore, the above description should not be interpreted as a limitation on the present invention but merely an illustration.

In embodiments, the controller 116 is configured to communicate with the SEM 102, the inspection system 104 (e.g., optical inspection system 106 and/or eBeam inspection system 108), the optical metrology system 110, and/or a process tool 122. For example, the controller 116 can be configured to receive data from or send data to the SEM 102, inspection system 104 (e.g., optical inspection system 106 and/or eBeam inspection system 108), optical metrology system 110, and/or process tool 122. The controller 116 can be configured to receive any combination of raw data, processed data (e.g., thickness measurements, surface uniformity/non-uniformity measurements, and the like), and/or partially-processed data. For example, the controller 116 may be configured to receive inspection data, metrology data, process tool data, and the like.

The controller 116 can be further configured to send data and/or control signals to the SEM 102, inspection system 104 (e.g., optical inspection system 106 and/or eBeam inspection system 108), the optical metrology system 110, and/or process tool 122. In some embodiments, the controller 116 may be configured to control one or more operating parameters of the SEM 102, inspection system 104 (e.g., optical inspection system 106 and/or eBeam inspection system 108), optical metrology system 110, and/or process tool 122. For example, the controller 116 may be configured to control one or more illumination parameters (e.g., illumination intensity, wavelength, bandwidth, frequency, spot size, etc.), scan pattern, scan speed, optical parameters (e.g., focus, relative lens positions, aperture size, filter arrangements, lens arrangements, etc.), SEM parameters, process tool parameters (e.g., spatial, timing, and/or material deposition parameters), and so forth.

Further, the steps described throughout the present disclosure may be carried out by a single controller 116 or, alternatively, multiple controllers. Additionally, the controller 116 may include one or more controllers housed in a common housing or within multiple housings. In this way, any controller or combination of controllers may be separately packaged as a module suitable for integration into the system 100. For instance, the controller 116 may operate as a centralized processing platform for the SEM 102, inspection system 104 (e.g., optical inspection system 106 and/or eBeam inspection system 108), optical metrology system 110, and/or process tool 122 and may implement one or more analysis (e.g., measurement) algorithms to received data (raw and/or partially-processed) to determine one or more sample attributes or parameters (e.g., film height/thickness, surface uniformity/non-uniformity, etc.) and/or generate control parameters (e.g., tool parameters) based on collected data.

In embodiments, the process tool 122 comprises a lithography tool, an etch tool, a chemical-mechanical polishing (CMP) tool, a deposition tool (e.g., a chemical vapor deposition (CVD) tool, a physical vapor deposition (PVD) tool, an atomic layer deposition tool, etc.), a cleaning tool, a plating tool, an ion implantation tool, and a thermal tool (e.g., a rapid thermal annealing tool), or the like. Some other examples of process tools (e.g., process equipment) are discussed in U.S. Pat. No. 8,284,394. Additional examples of inspection/metrology tools are also discussed in U.S. Pat. No. 8,284,394. U.S. Pat. No. 8,284,394 is incorporated herein by references in its entirety, and it is noted that, in some embodiments, the inspection system 104, optical metrology system 110, and/or process tool 122 may comprise any of the respective inspection systems, metrology tools, or process equipment disclosed in U.S. Pat. No. 8,284,394.

Figure 3A:
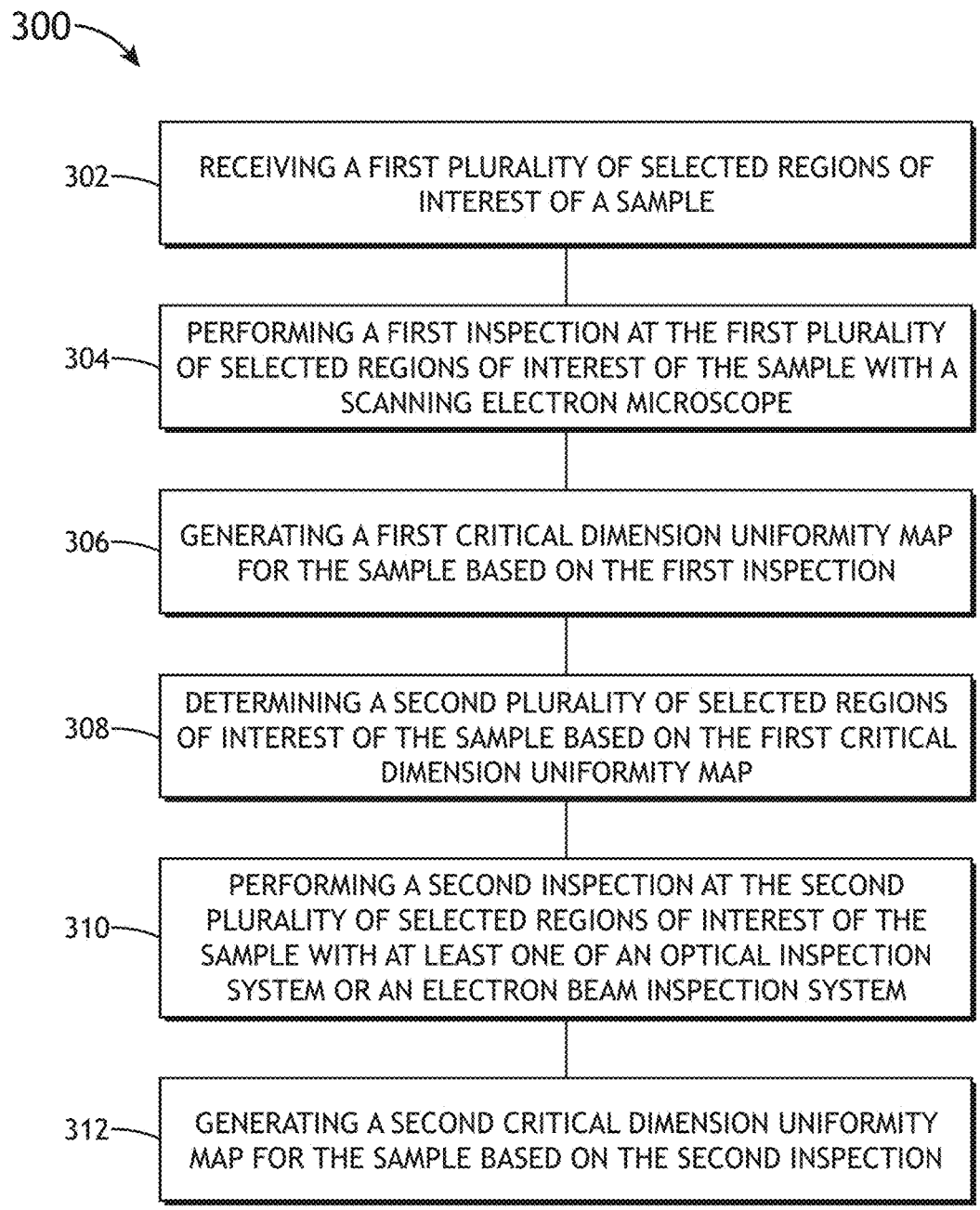
FIG. 3A is a portion of a flow diagram illustrating a method that employs integrated scanning electron microscopy and optical analysis techniques for advanced process control, in accordance with one or more implementations.
Figure 3B:
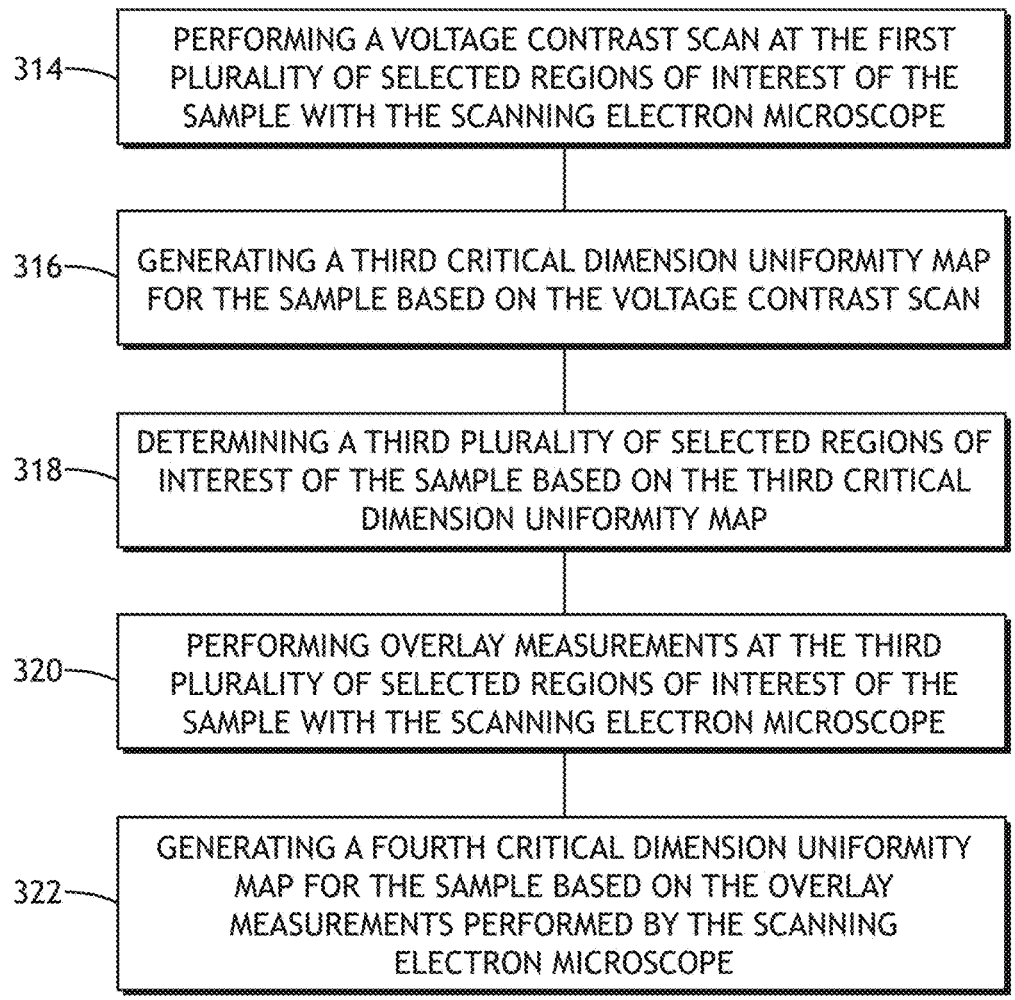
FIG. 3B is a portion of a flow diagram illustrating a method that employs integrated scanning electron microscopy and optical analysis techniques for advanced process control, in accordance with one or more implementations.
Figure 3C:
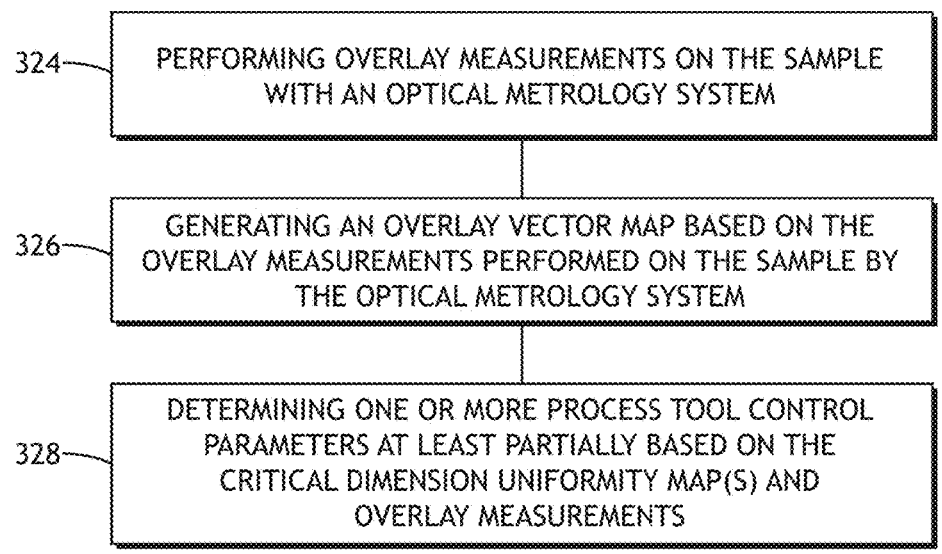
FIG. 3C is a portion of a flow diagram illustrating a method that employs integrated scanning electron microscopy and optical analysis techniques for advanced process control, in accordance with one or more implementations.

FIGS. 3A through 3C illustrate steps performed in a method 300 that employs integrated scanning electron microscopy and optical analysis techniques for advanced process control, in accordance with one or more embodiments of the present disclosure. Embodiments and enabling technologies described previously herein in the context of system 100 should be interpreted to extend to method 300. It is further noted, however, that the method 300 is not limited to the architecture of system 100.

At step 302, the method 300 includes receiving a first plurality of selected regions of interest (ROIs) of a sample 114. In embodiments, the controller 116 is configured to receive a plurality of selected ROIs of the sample 114. For example, the controller 116 may receive one or more user inputs (e.g., ROI and/or defect of interest (DOI) selections). In some embodiments, the controller 116 is configured to receive the ROI or DOI selections from the process tool 122 and/or configured to determine the selected ROIs based on one or more process tool 122 outputs (e.g., based on sample processing parameters or expected sample attributes).

At step 304, the method 300 includes performing an inspection at the first plurality of selected ROIs of the sample 114 with a SEM 102. In embodiments, the SEM 102 is configured to perform an inspection at the selected ROIs of the sample 114. For example, the SEM 102 can be configured to perform the inspection based on one or more user inputs to the SEM 102, or the controller 116 can be configured to send one or more control signals to the SEM 102 that cause the SEM 102 to inspect the selected ROIs of the sample 114.

Figure 2A:
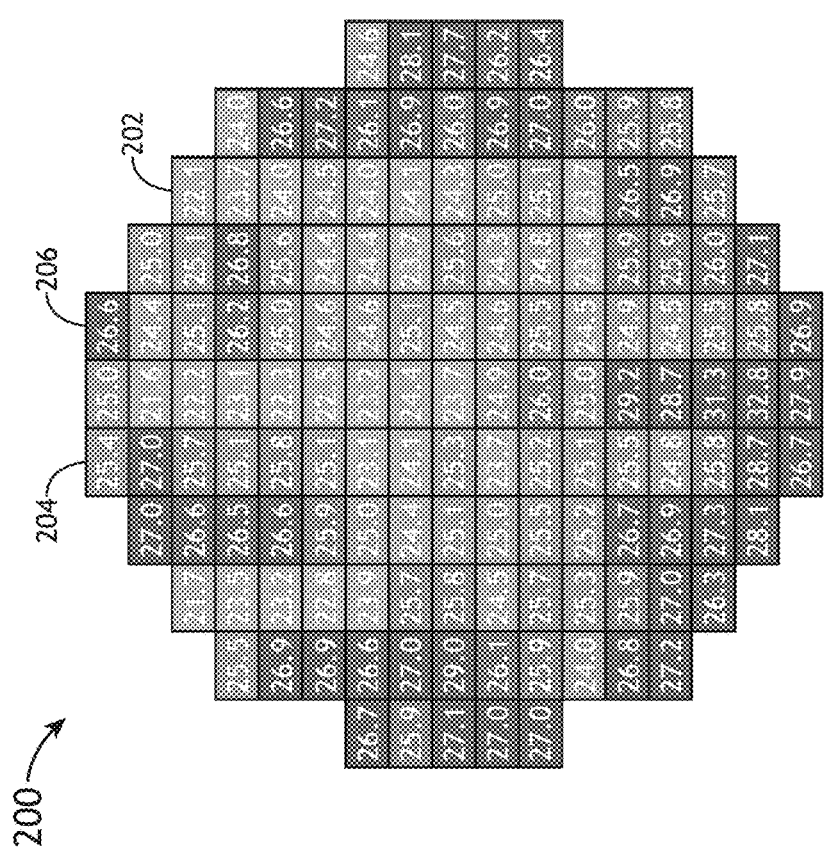
FIG. 2A is an example of a critical dimension uniformity (CDU) map based on an inspection performed by a scanning electron microscope (SEM) at a plurality of selected regions of interest, in accordance with one or more embodiments of the present disclosure.

At step 306, the method 300 includes generating a first critical dimension uniformity (CDU) map for the sample 114 based on the inspection performed by the SEM 102. In embodiments, the controller 116 is configured to receive inspection data (e.g., sample surface measurements, image data, DOI data, and the like) from the SEM 102. The controller 116 may be configured to generate a CDU map based on the inspection data. For example, FIG. 2A shows an example of a CDU map 200 that can be generated by the controller 116 based on the inspection data. The CDU map 200 may include pattern or color identifications of sample 114 portions (e.g., dies) that are characterized as having successful, failing, or uncertain readings. For example, in the CDU map 200, a first color (e.g., green) or pattern block 202 may indicate success, a second color (e.g., grey) or pattern block 204 may indicate uncertainty, and a third color (e.g., red) or pattern block 206 may indicate failure.

At step 308, the method 300 includes determining a second plurality of selected ROIs of the sample 114 based on the first CDU. In embodiments, the controller 116 is configured to determine selected ROIs requiring further review based on a CDU map (e.g., CDU map 200) generated at step 306. For example, the controller 116 may be configured to identify the uncertain and/or failed readings (e.g., blocks 204 and 206) as the selected ROIs requiring further review.

At step 310, the method 300 includes performing a second inspection at the second plurality of selected ROIs of the sample 114 (i.e., the ROIs identified as requiring further review) with another inspection system 104 (e.g., optical inspection system 106 and/or eBeam inspection system 108). In embodiments, the optical inspection system 106 and/or eBeam inspection system 108 is configured to perform an inspection at the second plurality of selected ROIs of the sample 114. For example, the optical inspection system 106 and/or eBeam inspection system 108 can be configured to perform the inspection based on one or more user inputs to the optical inspection system 106 and/or eBeam inspection system 108, or the controller 116 can be configured to send one or more control signals to the optical inspection system 106 and/or eBeam inspection system 108 that cause the optical inspection system 106 and/or eBeam inspection system 108 to inspect the second plurality of selected ROIs of the sample 114 (e.g., the ROIs identified by the controller 116 as requiring further review). In some embodiments, the SEM 102 is also configured to perform an inspection (e.g., a re-inspection) at the second plurality of selected ROIs of the sample 114. For example, the SEM 102 can be configured to perform the inspection based on one or more user inputs to the SEM 102, or the controller 116 can be configured to send one or more control signals to the SEM 102 that cause the SEM 102 to re-inspect the second plurality of selected ROIs of the sample 114 (e.g., the ROIs identified by the controller 116 as requiring further review).

In some implementations, the optical inspection and/or eBeam inspection need not be a dedicated step in method 300. The optical inspection and SEM review (e.g., re-inspection) data from a conventional inspection-review exercise may be also be used. In other implementations, for certain layers or DOIs, the optical inspection and SEM review (e.g., re-inspection) steps can be replaced by eBeam inspection without optical inspection and/or SEM review.

Figure 2B:
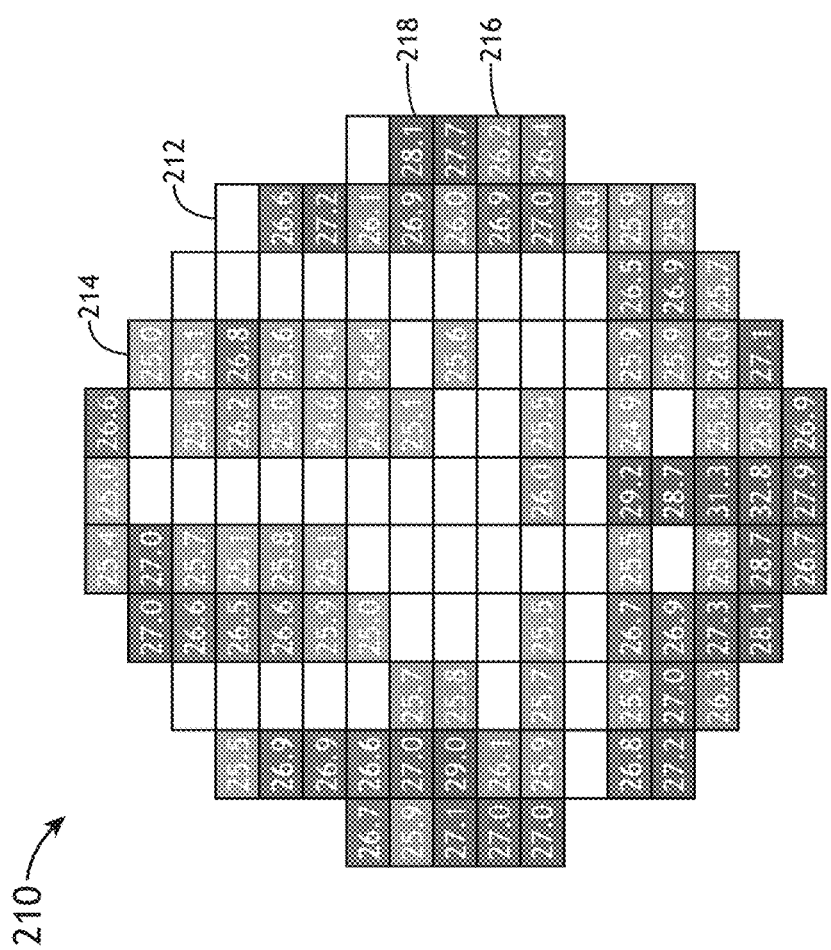
FIG. 2B is an example of a CDU map based on an inspection performed by an optical inspection system or an eBeam inspection system at a plurality of selected regions of interest, wherein the plurality of selected regions of interest is determined based on the CDU map of FIG. 2A, in accordance with one or more embodiments of the present disclosure.

At step 312, the method 300 includes generating a second CDU map for the sample 114 based on the inspection performed by the optical inspection system 106 and/or eBeam inspection system 108, and/or the re-inspection performed by the SEM 102. In embodiments, the controller 116 is configured to receive inspection data (e.g., sample surface measurements, image data, DOI data, and the like) from the optical inspection system 106 and/or eBeam inspection system 108, and/or re-inspection data from the SEM 102. The controller 116 may be configured to generate a CDU map based on the inspection data from the optical inspection system 106 and/or eBeam inspection system 108, and/or re-inspection data from the SEM 102. For example, FIG. 2B shows an example of a CDU map 210 that can be generated by the controller 116 based on the inspection data from the optical inspection system 106 and/or eBeam inspection system 108, and/or re-inspection data from the SEM 102. The CDU map 210 may include pattern or color identifications of sample 114 portions (e.g., dies) that are characterized as having previously stored readings, or successful, failing, or uncertain readings. For example, in the CDU map 210, a first color (e.g., white or blank) or pattern (e.g., no-fill) block 212 may indicate a previously stored reading, a second color (e.g., green) or pattern block 214 may indicate success, a third color (e.g., grey) or pattern block 216 may indicate uncertainty, and a fourth color (e.g., red) or pattern block 218 may indicate failure.

In some implementations, the method 300 further includes steps 314 through 322 of performing voltage contrast (VC) scans and/or metrology measurements on the sample 114 with the SEM 102. In other implementations, the method 300 may proceed directly from step 312 to steps 324 through 328 of performing optical metrology on the sample 114 and determining one or more process tool parameters for APC feedback or feedforward loops.

At step 314, the method 300 includes performing a VC scan at the first plurality of selected ROIs of the sample 114 with the SEM 102. In embodiments, the SEM 102 is configured to perform a VC scan at the selected ROIs of the sample 114. For example, the SEM 102 can be configured to perform the VC scan based on one or more user inputs to the SEM 102, or the controller 116 can be configured to send one or more control signals to the SEM 102 that cause the SEM 102 to perform a VC scan for the selected ROIs of the sample 114.

Figure 2C:
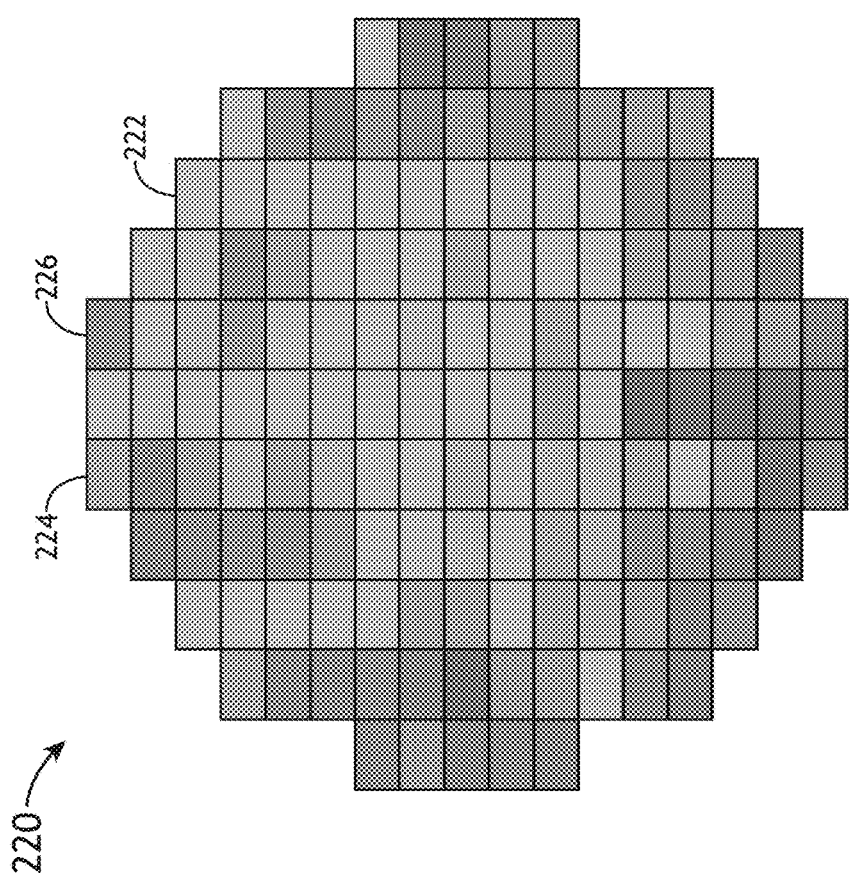
FIG. 2C is an example of a CDU map based on a voltage contrast (VC) scan performed by a SEM at a plurality of selected regions of interest, in accordance with one or more embodiments of the present disclosure.

At step 316, the method 300 includes generating a third CDU map for the sample 114 based on the VC scan performed by the SEM 102. In embodiments, the controller 116 is configured to receive VC scan data (e.g., VC image data and/or measurements) from the SEM 102. The controller 116 may be configured to generate a CDU map based on the VC scan data. For example, FIG. 2C shows an example of a CDU map 220 that can be generated by the controller 116 based on the VC scan data. The CDU map 220 may include pattern or color identifications of sample 114 portions (e.g., dies) that are characterized as having successful, failing, or uncertain readings. For example, in the CDU map 220, a first color (e.g., green) or pattern block 222 may indicate success, a second color (e.g., grey) or pattern block 224 may indicate uncertainty, and a third color (e.g., red) or pattern block 226 may indicate failure.

At step 318, the method 300 includes determining a third plurality of selected ROIs of the sample 114 based on the first CDU. In embodiments, the controller 116 is configured to determine selected ROIs requiring further review based on a CDU map (e.g., CDU map 220) generated at step 316. For example, the controller 116 may be configured to identify the uncertain and/or failed readings (e.g., blocks 224 and 226) as the selected ROIs requiring further review.

At step 320, the method 300 includes performing overlay measurements at the third plurality of selected ROIs of the sample 114 (i.e., the ROIs identified as requiring further review at step 318) with the SEM 102. In embodiments, the SEM 102 is configured to perform overlay measurements at the third plurality of selected ROIs of the sample 114. For example, the SEM 102 can be configured to perform the overlay measurements based on one or more user inputs to the SEM 102, or the controller 116 can be configured to send one or more control signals to the SEM 102 that cause the SEM 102 to perform overlay measurements at the third plurality of selected ROIs of the sample 114 (e.g., the ROIs identified by the controller 116 as requiring further review at step 318). In implementations, the SEM overlay measurements can be either performed with specific overlay targets in scribeline or with on-device structures. Furthermore, the results can be combined with optical overlay measurements to evaluate non-zero offsets (NZO) as well.

Figure 2D:
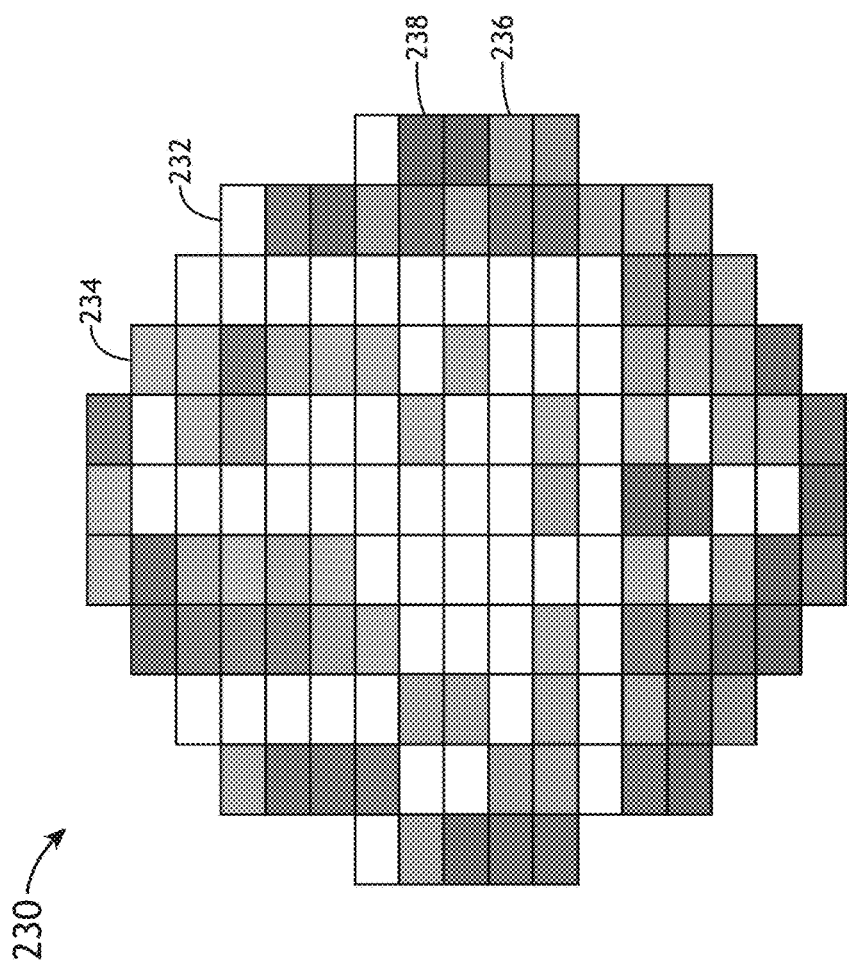
FIG. 2D is an example of a CDU map based on overlay measurements performed by a SEM at a plurality of selected regions of interest, wherein the plurality of selected regions of interest is determined based on the CDU map of FIG. 2C, in accordance with one or more embodiments of the present disclosure.

At step 322, the method 300 includes generating a fourth CDU map for the sample 114 based on the overlay measurements performed by the SEM 102. In embodiments, the controller 116 is configured to receive measurement data (e.g., sample surface measurements, layer-to-layer and/or pattern alignment measurements, overlay error measurements, and the like) from the SEM 102. The controller 116 may be configured to generate a CDU map based on the measurement data from the SEM 102. For example, FIG. 2D shows an example of a CDU map 230 that can be generated by the controller 116 based on the measurement data from the SEM 102. The CDU map 230 may include pattern or color identifications of sample 114 portions (e.g., dies) that are characterized as having previously stored readings, or successful, failing, or uncertain readings. For example, in the CDU map 230, a first color (e.g., white or blank) or pattern (e.g., no-fill) block 232 may indicate a previously stored reading, a second color (e.g., green) or pattern block 234 may indicate success, a third color (e.g., grey) or pattern block 236 may indicate uncertainty, and a fourth color (e.g., red) or pattern block 238 may indicate failure.

At step 324, the method 300 includes performing overlay measurements on the sample 114 with an optical metrology system 110. In embodiments, the optical metrology system 110 is configured to perform overlay measurements on an entirety (or substantially entirety) of a surface of the sample 114 or at selected ROIs of the sample 114. For example, the optical metrology system 110 can be configured to perform the overlay measurements based on one or more user inputs to the optical metrology system 110, or the controller 116 can be configured to send one or more control signals to the optical metrology system 110 that cause the optical metrology system 110 to perform overlay measurements on a surface of the sample 114 and/or selection portions (ROIs) of a surface of the sample 114.

Figure 2E:
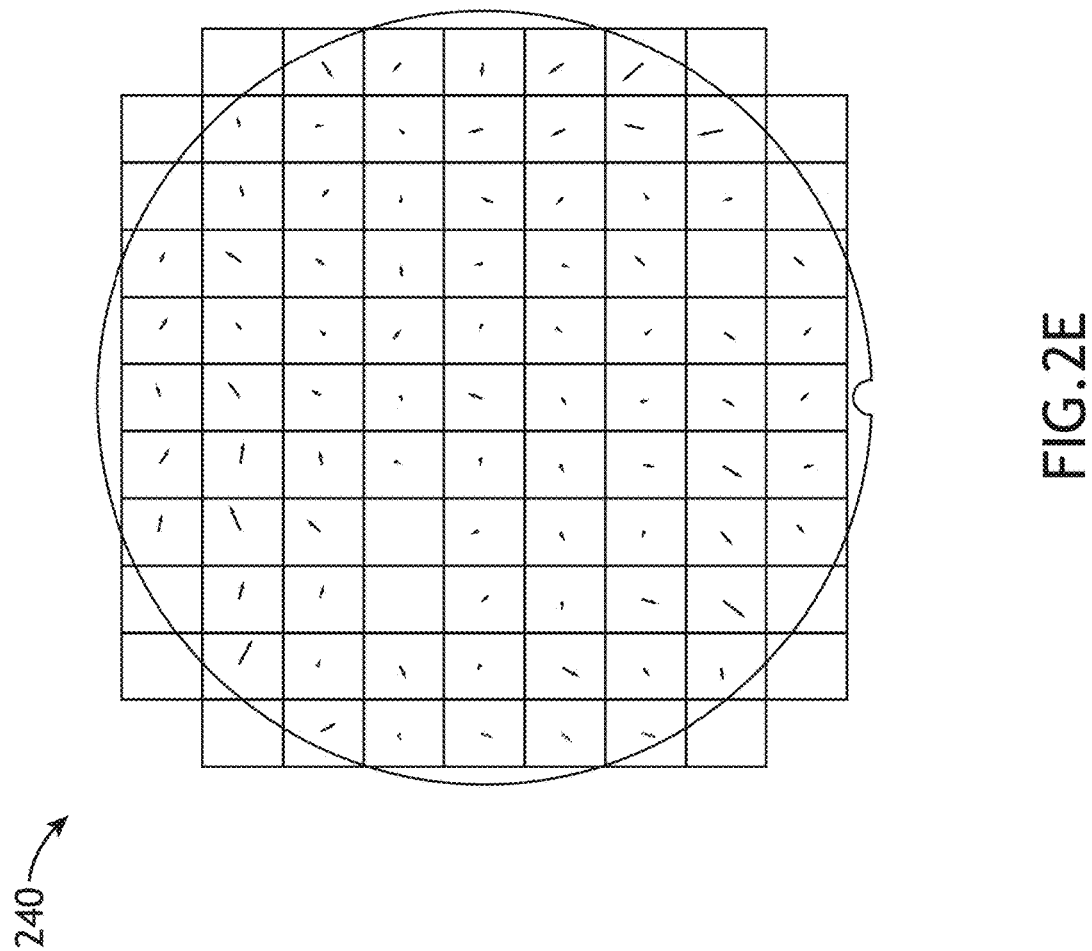
FIG. 2E is an example of a vector map based on overlay measurements performed by an optical metrology system, in accordance with one or more embodiments of the present disclosure.

At step 326, the method 300 includes generating an overlay vector map for the sample 114 based on the overlay measurements performed by the SEM 102. In embodiments, the controller 116 is configured to receive measurement data (e.g., sample surface measurements, layer-to-layer and/or pattern alignment measurements, overlay error measurements, and the like) from the optical metrology system 110. The controller 116 may be configured to generate an overlay vector map based on the measurement data from the optical metrology system 110. For example, FIG. 2E shows an example of an overlay vector map 240 that can be generated by the controller 116 based on the measurement data from the optical metrology system 110.

At step 328, the method 300 includes determining one or more control parameters for the process tool 122 at least partially based on the CDUs and overlay measurements. In embodiments, the controller 116 is further configured to determine the one or more process tool control parameters at least partially based on the overlay measurements performed on the sample 114 by the optical metrology system 110 and/or information derived from the overlay vector map (e.g., map 240) generated at step 326 in combination with inspection data, VC scan data, SEM overlay data, and/or information derived from the CDU map (e.g., CDU map 200) generated at step 306, the CDU map (e.g., CDU map 210) generated at step 312, the CDU map (e.g., CDU map 220) generated at step 316, and/or the CDU map (e.g., CDU map 230) generated at step 322. In some embodiments, the controller 116 is further configured to transmit the one or more process tool control parameters to the process tool 122, for example, for an APC feedback and/or feedforward loop.

In some implementations, the data associated with step 306, step 312, and/or step 316 is also used for feedforward APC models. Meanwhile, the data associated with steps 316, 322, and/or 326 can be used for scanner (e.g., inspection/metrology scanner) feedback and/or for feedback to the process tool 122.

Not all the steps are mandatory for every use-case. The individual steps and the order can be custom-made depending on the layer studied, process (e.g., front-end-of-line (FEoL), middle-of-line (MoL), back-end-of-line (BEoL), etc.), DOI type, and so forth. The data collected over the sequence of steps will help improve process control throughput by improving the sampling strategy at slower steps. Also, by integrating the data collected by different metrology and inspection-review steps, a host of feed forward and feedback APC loops can be enabled for tighter process control and device variability compensation.

The system 100 and method 300 disclosed includes metrology and inspection routines put together to get differentiated data for faster and better process control. This can allow for finer and more involved sampling at the edge of a process window or failing parts by smartly combining the optical tools & eBeam tools. The disclosed system 100 and method 300 combine CDU+overlay data, which presents the edge placement error definitions, with inspection (+VC) data, which is useful in advanced patterning schemes like SAxP and (LE)$^n$. The sampling scheme and density of measurements/area coverage is determined by throughout of the respective steps (optical/eBeam), thereby getting improved throughout/sensitivity compromise of optical/eBeam tools.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system for analyzing a sample, comprising:
    a scanning electron microscope;
    an optical inspection system;
    an optical metrology system; and
    at least one controller communicatively coupled to the scanning electron microscope, the optical inspection system, and the optical metrology system, the at least one controller configured to:
        receive a first plurality of selected regions of interest of the sample;
        generate a first critical dimension uniformity map for the sample based on a first inspection performed by the scanning electron microscope at the first plurality of selected regions of interest;
        determine a second plurality of selected regions of interest of the sample based on the first critical dimension uniformity map;
        generate a second critical dimension uniformity map for the sample based on a second inspection performed by the optical inspection system at the second plurality of selected regions of interest; and
        determine one or more process tool control parameters at least partially based on the second critical dimension uniformity map and on overlay measurements performed on the sample by the optical metrology system.

2. The system of claim 1, wherein the at least one controller is configured to transmit the one or more process tool control parameters to a process tool.

3. The system of claim 2, wherein the at least one controller is configured to receive the first plurality of selected regions of interest of the sample from the process tool.

4. The system of claim 2, wherein the process tool comprises a lithography tool.

5. The system of claim 1, wherein the optical inspection system comprises a broadband plasma inspection system.

6. The system of claim 1, wherein the optical metrology system comprises an optical overlay metrology system.

7. The system of claim 1, wherein the at least one controller is further configured to generate an overlay vector map based on the overlay measurements performed on the sample by the optical metrology system.

8. The system of claim 1, wherein the at least one controller is further configured to:
    generate a third critical dimension uniformity map for the sample based on a voltage contrast scan performed by the scanning electron microscope at the first plurality of selected regions of interest;
    determine a third plurality of selected regions of interest of the sample based on the third critical dimension uniformity map; and
    generate a fourth critical dimension uniformity map for the sample based on overlay measurements performed on the sample by the scanning electron microscope at the third plurality of selected regions of interest.

9. The system of claim 8, wherein the at least one controller is further configured to determine the one or more process tool control parameters at least partially based on the fourth critical dimension uniformity map.

10. A system for analyzing a sample, comprising:
    a scanning electron microscope;
    an electron beam inspection system;
    an optical metrology system; and
    at least one controller communicatively coupled to the scanning electron microscope and the optical metrology system, the at least one controller configured to:
        receive a first plurality of selected regions of interest of the sample;
        generate a first critical dimension uniformity map for the sample based on a first inspection performed by the scanning electron microscope at the first plurality of selected regions of interest;
        determine a second plurality of selected regions of interest of the sample based on the first critical dimension uniformity map;
        generate a second critical dimension uniformity map for the sample based on a second inspection performed by the electron beam inspection system at the second plurality of selected regions of interest; and
        determine one or more process tool control parameters at least partially based on the second critical dimension uniformity map and on overlay measurements performed on the sample by the optical metrology system.

11. The system of claim 10, wherein the at least one controller is configured to transmit the one or more process tool control parameters to a process tool.

12. The system of claim 11, wherein the at least one controller is configured to receive the first plurality of selected regions of interest of the sample from the process tool.

13. The system of claim 11, wherein the process tool comprises a lithography tool.

14. The system of claim 10, wherein the optical metrology system comprises an optical overlay metrology system.

15. The system of claim 10, wherein the at least one controller is further configured to generate an overlay vector map based on the overlay measurements performed on the sample by the optical metrology system.

16. The system of claim 10, wherein the at least one controller is further configured to:
    generate a third critical dimension uniformity map for the sample based on a voltage contrast scan performed by the scanning electron microscope at the first plurality of selected regions of interest;
    determine a third plurality of selected regions of interest of the sample based on the third critical dimension uniformity map; and
    generate a fourth critical dimension uniformity map for the sample based on overlay measurements performed on the sample by the scanning electron microscope at the third plurality of selected regions of interest.

17. The system of claim 16, wherein the at least one controller is further configured to determine the one or more process tool control parameters at least partially based on the fourth critical dimension uniformity map.

18. A method of analyzing a sample, comprising:
receiving a first plurality of selected regions of interest of a sample;
performing a first inspection at the first plurality of selected regions of interest of the sample with a scanning electron microscope;
generating a first critical dimension uniformity map for the sample based on the first inspection;
determining a second plurality of selected regions of interest of the sample based on the first critical dimension uniformity map;
performing a second inspection at the second plurality of selected regions of interest of the sample with at least one of an optical inspection system or an electron beam inspection system;
generating a second critical dimension uniformity map for the sample based on the second inspection;
performing overlay measurements on the sample with an optical metrology system; and
determining one or more process tool control parameters at least partially based on the second critical dimension uniformity map and the overlay measurements.

19. The method of claim 18, further comprising:
transmitting the one or more process tool control parameters to a process tool.

20. The method of claim 19, wherein the first plurality of selected regions of interest of the sample are received from the process tool.

21. The method of claim 18, further comprising:
generating an overlay vector map based on the overlay measurements performed on the sample by the optical metrology system.

22. The method of claim 18, further comprising:
performing a voltage contrast scan at the first plurality of selected regions of interest of the sample with the scanning electron microscope;
generating a third critical dimension uniformity map for the sample based on the voltage contrast scan;
determining a third plurality of selected regions of interest of the sample based on the third critical dimension uniformity map;
performing overlay measurements at the third plurality of selected regions of interest of the sample with the scanning electron microscope; and
generating a fourth critical dimension uniformity map for the sample based on the overlay measurements performed by the scanning electron microscope.

23. The method of claim 22, further comprising:
determining the one or more process tool control parameters at least partially based on the fourth critical dimension uniformity map.

24. A controller for a sample analysis system, comprising:
at least one processor; and
at least one memory medium communicatively coupled to the at least one processor, the at least one memory medium including program instructions that are executable by the at least one processor and configured to cause the processor to:
receive a first plurality of selected regions of interest of a sample;
generate a first critical dimension uniformity map for the sample based on a first inspection performed by a scanning electron microscope at the first plurality of selected regions of interest;
determine a second plurality of selected regions of interest of the sample based on the first critical dimension uniformity map;
generate a second critical dimension uniformity map for the sample based on a second inspection performed at the second plurality of selected regions of interest by at least one of an optical inspection system or an electron beam inspection system; and
determine one or more process tool control parameters at least partially based on the second critical dimension uniformity map and on overlay measurements performed on the sample by an optical metrology system.

25. The controller of claim 24, wherein the program instructions are further configured to cause the processor to:
transmit the one or more process tool control parameters to a process tool.

26. The controller of claim 25, wherein the program instructions are further configured to cause the processor to:
receive the first plurality of selected regions of interest of the sample from the process tool.

27. The controller of claim 24, wherein the program instructions are further configured to cause the processor to:
generate an overlay vector map based on the overlay measurements performed on the sample by the optical metrology system.

28. The controller of claim 24, wherein the program instructions are further configured to cause the processor to:
generate a third critical dimension uniformity map for the sample based on a voltage contrast scan performed by the scanning electron microscope at the first plurality of selected regions of interest;
determine a third plurality of selected regions of interest of the sample based on the third critical dimension uniformity map; and
generate a fourth critical dimension uniformity map for the sample based on overlay measurements performed on the sample by the scanning electron microscope at the third plurality of selected regions of interest.

29. The controller of claim 28, wherein the program instructions are further configured to cause the processor to:
determine the one or more process tool control parameters at least partially based on the fourth critical dimension uniformity map.

* * * * *